United States Patent [19]
Casey

[11] Patent Number: 6,092,714
[45] Date of Patent: Jul. 25, 2000

[54] METHOD OF UTILIZING A PLASMA GAS MIXTURE CONTAINING ARGON AND CF$_4$ TO CLEAN AND COAT A CONDUCTOR

[75] Inventor: William J. Casey, Meridian, Id.

[73] Assignee: MCMS, Inc., Boise, Id.

[21] Appl. No.: 09/270,646

[22] Filed: Mar. 16, 1999

[51] Int. Cl.$^7$ .............................. B23K 9/00; B23K 28/00; B23K 1/20; B23K 31/02
[52] U.S. Cl. .......................... 228/205; 228/135; 228/177; 228/201
[58] Field of Search .................... 228/205, 135, 228/136, 177, 201

[56] References Cited

U.S. PATENT DOCUMENTS

| | | | |
|---|---|---|---|
| 4,646,958 | 3/1987 | Howard, Jr. | 228/123 |
| 4,797,178 | 1/1989 | Bui et al. | 156/643 |
| 4,921,157 | 5/1990 | Dishon et al. | 228/124 |
| 5,071,486 | 12/1991 | Chasteen | 134/2 |
| 5,115,166 | 5/1992 | Campbell et al. | 315/111.21 |
| 5,139,193 | 8/1992 | Todd | 228/180.2 |
| 5,223,691 | 6/1993 | Frei et al. | 219/121.46 |
| 5,380,557 | 1/1995 | Spiro | 427/249 |
| 5,384,167 | 1/1995 | Nishiwaki et al. | 427/569 |
| 5,413,759 | 5/1995 | Campbell et al. | 422/23 |
| 5,451,263 | 9/1995 | Linn et al. | 134/1.1 |
| 5,461,010 | 10/1995 | Chen et al. | 437/228 |
| 5,503,878 | 4/1996 | Suzuki et al. | 427/539 |
| 5,545,579 | 8/1996 | Liang et al. | 437/44 |
| 5,554,560 | 9/1996 | Hsue et al. | 437/69 |
| 5,576,101 | 11/1996 | Saitoh et al. | 428/332 |
| 5,580,792 | 12/1996 | Zhang et al. | 437/10 |
| 5,609,290 | 3/1997 | Bobbio et al. | 228/206 |
| 5,615,825 | 4/1997 | Bobbio et al. | 228/206 |
| 5,626,775 | 5/1997 | Roberts et al. | 216/67 |
| 5,668,038 | 9/1997 | Huang et al. | 438/396 |
| 6,008,137 | 12/1999 | Lee et al. | 438/724 |

*Primary Examiner*—Patrick Ryan
*Assistant Examiner*—Cecelia Newsome
*Attorney, Agent, or Firm*—Joseph W. Holland

[57] ABSTRACT

A method for cleaning and coating a conductor in a plasma reaction chamber utilizing a plasma gas mixture containing Argon and CF$_4$ to clean and coat a conductor. The method for cleaning and coating a conductor includes the combination of cleaning processes including, physical reduction and chemical reaction and the formation of a polymerization passivation film formed on oxyfluoro metal compositions (SnO$_x$F$_y$) which occur during exposure of a conductor to the process of the invention. The polymerization passivation film is formed as a result of the combination of the degraded carbon Tetrafloride (CF$_4$) gas and degraded environmental and casual hydrocarbons which are present in the form of a variety of unspecified organic contaminants to form crude polymeric molecules in the high energy environment of the plasma. The treatment of conductive surfaces according to the method of the present invention has shown to allow a soldering operation for 3 to 8 hours following treatment without additional preparation, cleaning or treatment.

1 Claim, 1 Drawing Sheet

METHOD OF UTILIZING A PLASMA GAS MIXTURE CONTAINING ARGON AND $CF_4$ TO CLEAN AND COAT A CONDUCTOR

BACKGROUND OF THE INVENTION

1. Technical Field

This invention generally relates to methods and devices for applying solder to workpieces and more particularly to a method for utilizing a plasma gas mixture containing Argon and $CF_4$ in a vacuum to clean and coat a conductor.

2. Background

Electronic fabrication processes include the attachment of various electrical elements, including discrete components, resistors, transistors, diodes, switching arrays and integrated circuits such as memory devices, microprocessors, and the like, together with a variety of other circuit elements such as transformers, connectors and heat sinks to a substrate such as printed circuit board which electrically connects and mechanically supports the variety of circuit elements.

Soldering is the most common process used for connecting the variety of circuit elements to the printed circuit board both physically and electrically, fixing them in position. Soldering involves the use of a low melting point metal alloy, usually of a lead-tin type, that when exposed to heat, typically at temperatures around 450° F., melts and flows between adjoining metal surfaces or contacts, joining the adjacent surfaces together.

Most soldering processes include three basic steps: pre-cleaning and deoxidizing, solder reflow or reflow joining, and post-cleaning of residue. Pre-cleaning and deoxidizing are usually accomplished by applying a flux material formulated to remove contaminants and oxides from the surfaces to be soldered. Soldering joins the surfaces to be soldered when the solder is reheated beyond its melting point. Oxides, typically with a higher melting point than solder, can form a barrier and prevent wetting of the surfaces to be soldered if they are not removed prior to the solder reflowing. Residue cleaning involves the removal of flux residue from the cleaning and deoxidizing step.

As the processing speeds of electronic devices increase it will be increasingly important to provide fabrication processes that maximize electron exchange properties in circuits. A flux residue with even moderate electromigration properties can cause extreme difficulties in high speed devices.

In addition, it has been observed that handling of components and assemblies, during fabrication and rework of electronic components, including BGA packages and chip scale packages (CSP) which have re-workable defects such as solder shorts or low volume solder, generally increases the organic contamination on component parts and assemblies. Therefore, a need exists not only to de-oxidize package conductors, but to clean such organic contamination from the electronic components prior to reuse.

Dry or fluxless soldering methods have eliminated the need for the use of a flux in the soldering process and therefore, to a great extent have eliminated the post-cleaning or residue cleaning step. Dry or fluxless soldering methods may theoretically replace the pre-cleaning and de-oxidizing steps in the soldering process. It is still necessary however, to deoxidize conductive surface to be soldered in order to insure complete solder reflow and bonding. Historically, fluxless soldering processes have accomplished the pre-cleaning and post-cleaning steps by employing high temperatures and pressures.

In the alternative, external energy or stimulation may be employed to initiate the deoxidization and cleaning. One method of dry or fluxless soldering, Plasma Assisted Dry Soldering (PAD), has been in existence for several years. While it has been demonstrated that PAD soldering provides an effective method of cleaning, it may not always provide an economical fluxless solution due to equipment costs. In addition, process times and costs may not be compatible with certain applications, for instance, in the high volume assembly manufacturing environment. It is therefore recognized that PAD technology has not adapted to the manufacturing environment well, primarily due the above problems.

Nevertheless, it would be desirable to provide a plasma assisted dry cleaning method which performs cleaning and de-oxidizing steps for conductors. In addition, it would be desirable to provide a plasma assisted dry cleaning method that in addition to cleaning would provide a means for protecting the cleaned and de-oxidized conductor surface for conductors which may be soldered at a later time.

Spiro, U.S. Pat. No. 5,380,557 discloses the formation of Carbon Fluorine compositions as non-wettable coatings for applications where wetting is undesirable. Spiro discloses the formation of Carbon Fluoride compositions in specified conditions to form thermally stable carbon fluoride films, high adhesion coatings, and bulk materials by degradation of vapors comprised of compounds containing fluorine and carbon into fragments, followed by condensation of these fragments onto a substrate, preferably maintained at a temperature lower than the fragments, but generally maintained at a temperature high enough for the fragments to have sufficient mobility and energy to rearrange. Spiro discloses the vaporization of compounds containing fluorine and carbon by direct heating, or entrainment with an inert gas such as argon, nitrogen, helium, and the like. The vapors of compounds containing fluorine and carbon are energized so as to degrade them into fragments. This can be accomplished by (1) passing the vaporized compounds over a hot filament or through a hot furnace of suitable temperature or (2) exposing the compounds to microwave (RF) radiation of a sufficient intensity or (3) exposing the compounds to light of a frequency which initiates photolysis. Following degradation, the fragments are condensed onto a substrate.

Spiro further discloses that the carbon fluoride solid compositions produced employing the invention described provide good coatings with high adhesion to the substrates on which they are formed.

In the context of electronics manufacturing, however, it would be desirable to provide a plasma assisted dry cleaning method that also applies a wettable protective coating to the cleaned and de-oxidized conductor surface for conductors which may be soldered at a later time.

In addition, it would be desirable to provide a plasma assisted dry cleaning method that provides a conductive surface that exhibits acceptable wettability in subsequent solder, reflow and sphere placement processes which may be performed as much as a several hours following treatment. In addition, it would be desirable to provide a plasma assisted dry cleaning method for cleaning reworked or salvaged electronic components, including BGA, μBGA and CSP packages which have re-workable defects such as solder shorts or low volume solder.

SUMMARY OF THE INVENTION

Accordingly, the present invention discloses a method for cleaning and coating a conductor in a plasma reaction chamber utilizing a plasma gas mixture containing Argon and $CF_4$ to clean and coat a conductor.

Generally speaking, in a plasma process, plasma ions are produced within the plasma sheath. These ions impinge on components which are left unmasked for the process. Specifically, the ions impinge on exposed conductors or conductive placement sites. The plasma ions react with various impurities on the exposed conductors or placement sites thereby cleaning and de-oxidizing the exposed conductive surfaces.

In one embodiment of the invention, the method is utilized to clean and protect a conductor for dry soldering attachment. The method uses a mixture of carbon Tetrafloride ($CF_4$) and Argon (Ar) gases in a vacuum to form reactive free radicals. This mixture removes oxides which have accumulated on the surface of conductors including the conductive sites of reclaimed integrated circuit packages including BGA, $\mu$BGA and CSP packages. The fluorine free radical is produced with generated plasma energy which reacts to combine chemically with various oxides that may have formed on the conductive surfaces.

The addition of Argon to the gas mixture is an important component of the present procedure in the fact it cleans the board surface with a physical reduction as opposed to a chemical reaction. The combination of these two processes, physical reduction combined with chemical reaction produces a cleaner surface finish with a greatly enhanced affinity for solder wetting.

It has been observed that the method of the present invention enhances the wetability of the conductor or the site surfaces for attachment of preformed solder spheres. Without limiting the scope of the invention, and not wishing to be limited by theory, it is believed that the improved wetability is a result, at least in part, of the combination of the cleaning processes, physical reduction combined with chemical reaction and the formation of a polymerization passivation film formed on oxyfluoro metal compositions ($SnO_xF_y$) which occur during exposure of a conductor to the plasma process employing the specified environments and in the presence of unspecified casual environmental organics.

That portion of the process which includes the step of physical reduction combined with chemical reaction may partially be expressed by the following process:

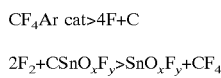

$$2F_2 + CSnO_xF_y > SnO_xF_y + CF_4$$

Once again, and without limiting the scope of the invention, and not wishing to be limited by theory, it is believed that the polymerization passivation film is formed as a result of the combination of the degraded carbon Tetrafloride ($CF_4$) gas as expressed above and degraded environmental and casual hydrocarbons which are present in the form of a variety of unspecified organic contaminants to form crude polymeric molecules in the high energy environment of the plasma.

This surface treatment has shown to have a wetting force comparable to an RA type flux, and a wetting speed similar to RMA type flux treatment. This treatment will allow a surface to stay in a condition wherein the conductor may be subjected to a soldering operation for 3 to 8 hours following treatment without additional preparation or treatment.

According to the invention, a dry cleaning process may also utilize a plasma mixture of Carbon Tetrafloride ($CF_4$), Argon (Ar) and Oxygen($O_2$), to form fluorine reactive free radicals. This mixture removes oxides which have accumulated on the surface of the placement site of electronic components.

As electronic components which have been cleaned and coated according to the present invention are subjected to subsequent solder processes, the polymerization passivation film breaks down and exposes an unpolluted conductive surface. As the solder becomes liquidus this film breaks down and exposes an unpolluted attachment surface.

The use of the process and method of the present invention, for de-oxidation, cleaning and the reclamation of integrated circuit packages including BGA components, is ideal. The low volumes and small physical size of the individual component parts as compared to the volumes and physical sizes of entire assemblies negate the need to purchase extremely large plasma reaction chambers thus reducing capitol costs but also process times.

It has been observed that the process and method of the present invention not only accomplishes a de-oxidation function in the proper environment, but it may also reduce or eliminate organic contamination thereby decreasing or eliminating electromigration problems. In addition, it has been observed that the process and method of the present invention results in the formation of a polymerization passivation film on oxy-floro metal compositions which remain on conductor surfaces following the process. Testing on components processed in accordance with the process and method of the present invention show that shear strengths after reflow are comparable to or higher than shear strengths when utilizing flux assisted soldering processes. In addition, conductors processed in accordance with the process and method of the present invention exhibit acceptable wettability in subsequent solder, reflow and sphere placement processes which may be performed as much as a several days following cleaning, de-oxidizing and coating.

Additional objects, advantages and novel features of the invention will be set forth in part in the description that follows, and in part will become apparent to those skilled in the art upon examination of the following, or may be learned by practice of the invention. The objects and advantages of the invention may be realized and attained by means of the instrumentalities and combinations particularly pointed out in the appended claims.

DETAILED DESCRIPTION OF THE INVENTION

Figure 1:
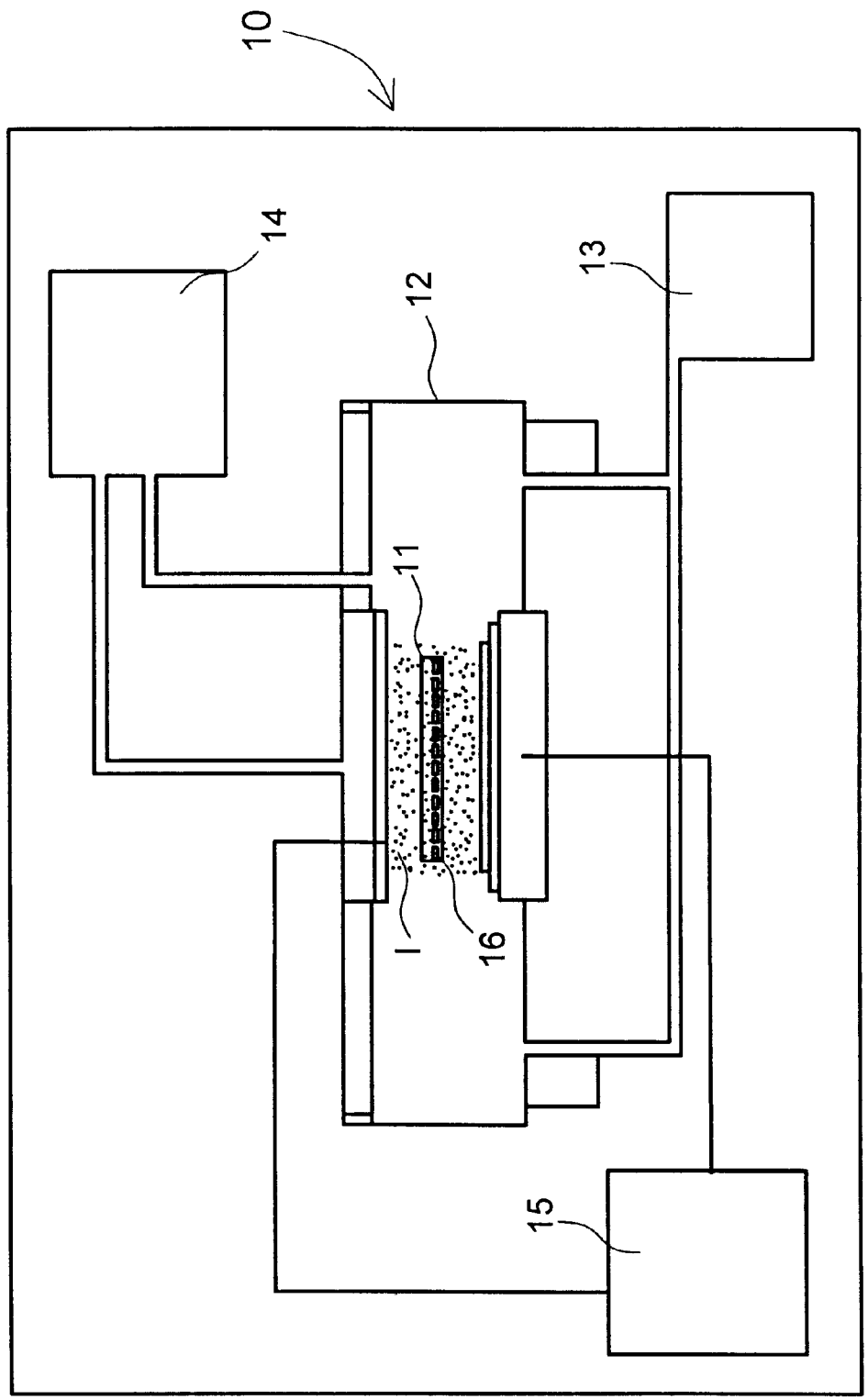
FIG. 1 is a schematic representation of a component being treated in a plasma reactor.

Referring to FIG. 1, component 11 which requires rework is positioned within chamber 12 of plasma reactor 10. A vacuum is introduced within chamber 12 employing pump 13. Chamber 12 is purged using a mixture of carbon Tetrafloride ($CF_4$) and Argon (Ar) gas mixture provided from gas supply and mixing device 14 and plasma ions I are produced within the plasma sheath P. Ions I impinge on component 11, including conductive lands 16 which are left unmasked for the process.

In one embodiment of the invention, the process continues through a sequence of phases observing the following parameters:

Phase I: plasma gas mixture ratio, 60 $CF_4$/10 Ar; time 2–3 minutes; pressure, 275–325 m torr; power 525–575 watts.

Phase II: plasma gas mixture ratio, 20 $CF_4$/10 Ar; time 2.5–3.5 minutes; pressure 175–275 m torr; power 375–425 watts.

Phase III: plasma gas mixture ratio, 10 $CF_4$/30 $O_2$; time 1.5–2.5 minutes; pressure 175–250 m torr; power 325–375 watts.

In an alternate embodiment of the invention, the process continues through a series of phases observing the following parameters:

Phase I: plasma gas mixture ratio, 60 $CF_4$/10 Ar; time 2–3 minutes; pressure, 275–325 m torr; power 525–575 watts.

Phase II: plasma gas mixture ratio, 20 $CF_4$/10 Ar; time 2.5–3.5 minutes; pressure 175–275 m torr; power 375–425 watts.

Phase III: plasma gas mixture ratio, 10 $CF_4$/30 $O_2$; time 1.5–2.5 minutes; pressure 175–250 m torr; power 325–375 watts.

Phase IV: plasma gas mixture ratio, 100 $O_2$; time 0.75–1.25 minutes; pressure, 275–325 m torr; power 275–325 watts.

While the invention has been described with reference to specific embodiments thereof, it will be appreciated that numerous variations, modifications, and embodiments are possible, and accordingly, all such variations, modifications, and embodiments are to be regarded as being within the scope of the invention.

I claim:

1. A method for cleaning, de-oxidizing and coating a conductor for dry soldering attachment utilizing a plasma gas mixture containing carbon Tetrafloride ($CF_4$) and Argon (Ar) gases in a vacuum including the following steps:

positioning a component within a plasma chamber;

sealing the plasma chamber;

providing a first atmosphere within the plasma chamber with a first plasma gas mixture ratio of substantially 60 $CF_4$:10 Ar and a first negative pressure in the range of 275–325 m torr;

generating a plasma within the plasma chamber, the plasma having a first output power in the range of 525–575 watts for a first period of time in the range of 2–3 minutes;

providing a second atmosphere within the plasma chamber with a second plasma gas mixture ratio of substantially 20 $CF_4$:10 Ar and a second negative pressure in the range of 175–275 m torr;

generating a plasma within the plasma chamber, the plasma having a second output power in the range of 375–425 watts for a second period of time in the range of 2.5–3.5 minutes;

providing a third atmosphere within the plasma chamber with a third plasma gas mixture ratio of substantially 10 $CF_4$:30 $O_2$ and a third negative pressure in the range of 175–250 m torr;

generating a plasma within the plasma chamber, the plasma having a third output power in the range of 325–375 watts for a third period of time in the range of 1.5–2.5 minutes; and removing the component from the plasma chamber.

* * * * *